United States Patent [19]

Minami et al.

[11] Patent Number: 4,907,201

[45] Date of Patent: Mar. 6, 1990

[54] MOS TRANSISTOR CIRCUIT

[75] Inventors: Hiroshi Minami; Koreaki Fujita, both of Itami, Japan

[73] Assignee: Mitsubishi Denki Kabushiki Kaisha, Tokyo, Japan

[21] Appl. No.: 218,888

[22] Filed: Jul. 14, 1988

Related U.S. Application Data

[63] Continuation of Ser. No. 46,509, May 6, 1987, Pat. No. 4,661,779.

[30] Foreign Application Priority Data

May 7, 1986 [JP] Japan ............................... 61-104292

[51] Int. Cl.$^4$ ............................................. G11C 13/00
[52] U.S. Cl. ..................................... 365/207; 365/208
[58] Field of Search ....................... 365/206, 207, 208; 307/304

[56] References Cited

U.S. PATENT DOCUMENTS 4,767,942  8/1988  Minami et al. ....................... 307/304
4,825,418  4/1989  Itoh et al. ............................. 365/207

Primary Examiner—Terrell W. Fears
Attorney, Agent, or Firm—Saidman, Sterne, Kessler & Goldstein

[57] ABSTRACT

In a MOS transistor circuit (comprising a pair of current mirror circuits, each comprising: first and second MOS transistors having their gate electrodes connected together third and fourth MOS transistors respectively connected in series with the first and second transistors, the third and the fourth MOS transistors of the pair of current mirror circuits receiving a pair of complementary signals at their gate electrodes; and the nodes between the second and the fourth MOS transistors forming output nodes of the current mirror circuit), a pair of capacitors each coupling the output of one current mirror circuit to the gate electrodes of the first and the second MOS transistors of the other current mirror circuit. This provides positive feedback. The change in the outputs responsive to change in the inputs is thereby accelerated.

5 Claims, 2 Drawing Sheets

WITH COUPLING
CAPACITORS

WITHOUT
COUPLING
CAPACITORS

MOS TRANSISTOR CIRCUIT

This application is a continuation of application Ser. No. 046,059, filed 5-6-87 now U.S. Pat. No. 4,661,779.

BACKGROUND OF THE INVENTION

The present invention relates to MOS (metal oxide semiconductor) transistor circuits, particularly those having a current mirror voltage amplifier circuit.

An example of a MOS transistor circuit comprising two current mirror voltage amplifier circuits is shown in FIG. 1. A first one, shown as block 1, of the current mirror voltage amplifier circuits comprises PMOS (P-channel MOS) transistors TP1 and TP2, and NMOS (N-channel MOS) transistor TN1 and TN2. A second one, shown as block 2, of the current mirror voltage amplifier circuits comprises PMOS transistors TP3 and TP4, and NMOS transistors TN3 and TN4. Each of the MOS transistors comprises first and second main electrodes and a gate electrode.

The PMOS transistors TP1 to TP4 have their first main electrodes connected to a power supply V, and their second main electrodes connected to the first main electrodes of the NMOS transistors TN1 to TN4. The transistors TP1 and TP2 have their gate electrodes connected to each other and to the first main electrode of the transistor TN1. The transistors TP3 and TP4 have their gate electrodes connected to the first main electrode of the transistor TN3. The NMOS transistors TN1 to TN4 have their second main electrodes connected to the ground G. The transistors TN1 and TN2 have their gate electrodes connected to the gate electrodes of the transistors TN4 and TN3, respectively. The transistors TN1 and TN4 have their gate electrodes connected to a first input signal line N5, while the transistors TN2 and TN3 have their gate electrodes connected to a second input signal line N6. The transistors TN2 and TN4 have their gate electrodes connected to a first and a second output signal lines N7 and N8.

The operation of the circuit of FIG. 1 will now be described. Initially, the input signal lines N5 and N6 are in an intermediate state, i.e., the input signals are neither at "H" nor "L" for the transistors TN1 to TN4. Assume for instance, the potential on the signal line N5 slightly rises and the potential on the signal line N6 slightly falls. In the first current mirror circuit 1 comprising the transistors TP1, TP2, TN1 and TN2, the NMOS transistor TN1 becomes slightly "ON", and the current from a node N1 to the ground G slightly increases, and the potential on the node N1 slightly falls. The PMOS transistors TP1 and TP2 become slightly ON, and a current flows to a node N2. But the NMOS transistor TN2 is in a slightly "OFF" state, so that the potential on the node N2 rises. The output signal line N7 therefore becomes "H".

In the second current mirror circuit 2 comprising the transistors TP3, TP4, TN3 and TN4, the NMOS transistor TN3 becomes slightly "OFF", and a current from a node N3 to the ground G slightly decreases, and the potential on the node N3 slightly rises. The PMOS transistors TP3 and TP4 becomes slightly "OFF", and a current flowing to a node N4 decreases. But the NMOS transistor TN4 is in a slightly "ON" state, so that the current from the node N4 to the ground G increases, and the potential on the node N4 falls. The output signal line N8 therefore becomes "L".

Thus the two current mirror circuits 1 and 2 operate independently of each other.

The above-described MOS transistor circuit has been used as a high-speed voltage amplifier circuit in a semiconductor memory device and the like. But today an amplifier circuit with even higher speed is desired.

SUMMARY OF THE INVENTION

An object of the invention is to provide a MOS transistor circuit capable of voltage amplification at a higher speed than before.

A MOS transistor circuit according to the invention comprises a pair of current mirror voltage amplifier circuits, generally similar to that described above, but distinguished by capacitive coupling of the output of each current mirror voltage amplifier circuit to the gate electrodes of the MOS transistors of the other current mirror voltage amplifier circuit that are connected to each other.

Because of the capacitive coupling, the output signal of each current mirror voltage amplifier circuit is transmitted gate electrodes of the MOS transistors which determine the current through the respective MOS transistors. Application of the output to the gate electrodes accelerates the change in the currents and hence in the outputs. In other words the capacitive coupling provides a path for positive feedback. Accordingly, the voltage amplification is made at a higher speed.

DESCRIPTION OF THE PREFERRED EMBODIMENTS

Figure 1:
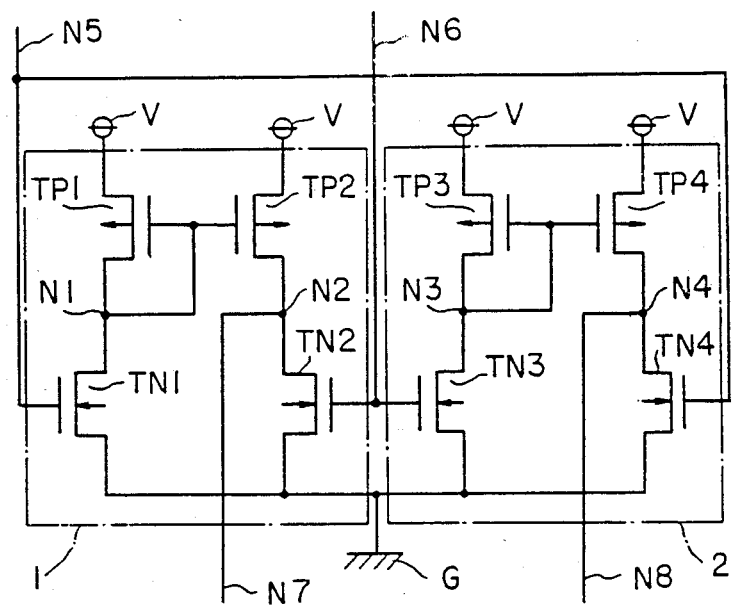
FIG. 1 is a circuit diagram showing a conventional MOS transistor circuit having current mirror amplifier circuits.
Figure 2:
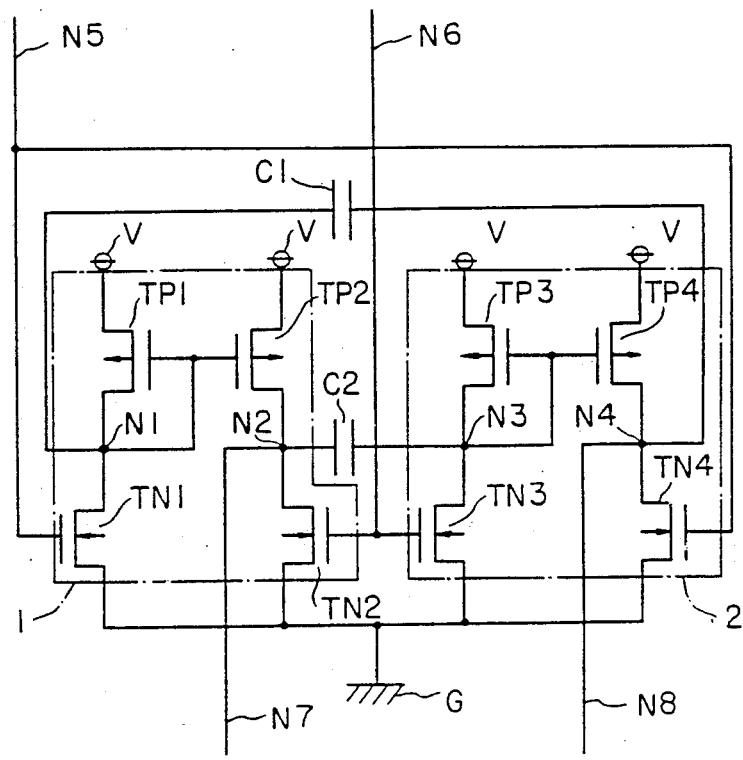
FIG. 2 is a MOS transistor circuit of an embodiment of the invention.

FIG. 2 shows a MOS transistor circuit having voltage amplifier circuits according to an embodiment of the invention. In the figure, reference numerals identical to those in FIG. 1 denote identical or similar coponents. The circuit configuration of FIG. 2 is generally identical to that of FIG. 1. But the circuit of FIG. 2 differs from the circuit of FIG. 1 in that it comprises a capacitor C1 coupling the first main electrode of the NMOS transistor TN4 with the gate electrodes of the PMOS transistors TP1 and TP2, and a capacitor C2 coupling the first main electrode of the NMOS transistor TN2 with the gate electrodes of the PMOS transistors TP3 and TP4. In other words, each of the capacitors C1 and C2 are connected to couple an output N4 or N2 of one of the current mirror amplifier circuits to the interconnected gate electrodes of the PMOS transistors of the other current mirror amplifier circuit.

Initially, the input signal lines N5 and N6 are in an intermediate state, i.e., the input signals are at a level which is neither at "H" nor "L" for the transistors TN1 to TN4.

Assume that the potential on the input signal line N5 slightly rises and the potential on the input signal line N6 slightly falls.

In the first current mirror circuit 1 comprising the transistors TP1, TP2, TN1 and TN2, the NMOS transistor TN1 becomes slightly "ON" and the current from the node N1 to the ground G increases, and the potential on the node N1 falls, as described with reference to FIG. 1.

In the circuit of FIG. 2, there is an additional contribution to the falling of the potential on the node N1. That is falling on the potential on the node N4, i. e., the output of the second current mirror circuit 2, contributes, by virtue of the capacitor C1 coupling the nodes N4 to N1, to the falling of the potential on the node N1. Such contribution accelerates the falling of the potential on the node N1. Thus the falling of the potential on the node N1 is quicker than in the prior art of FIG. 1. The circuit of FIG. 2 is therefore quicker than the circuit of FIG. 1 in the operations, by which the PMOS transistor TP1 and TP2 becomes "ON" and a current flows to the node N2, and with the NMOS transistor TN2 being slightly "OFF", the potential on the node N7 rises and the output signal line N7 become "H".

The second current mirror circuit 2 comprising the transistors TP3, TP4, TN3 and TN4 operate in a similar manner. The voltage amplification function is thereby improved.

Figure 3A:
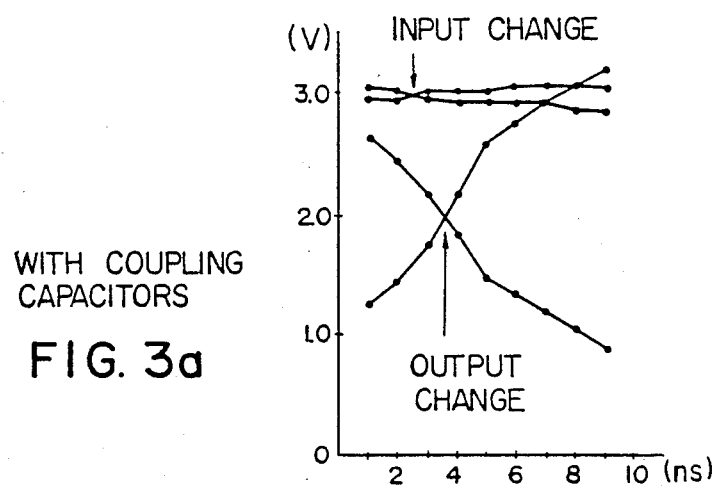
FIGS. 3a and 3b are waveform diagrams obtained by simulating the circuit of the embodiment and the conventional circuit.
Figure 3B:
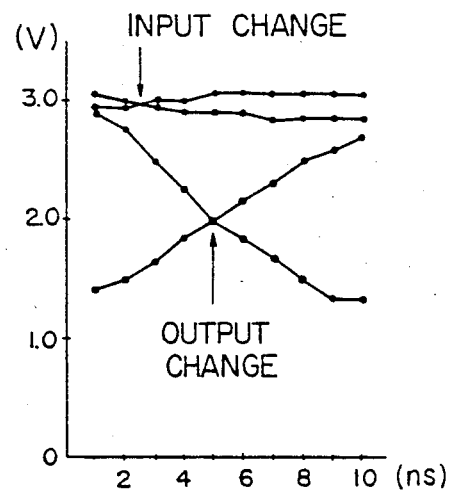

FIGS. 3a and 3b are waveform diagrams which were obtained by simulating the circuit of the embodiment with the capacitors and the conventional circuit without the capacitors. It was assumed that the power supply voltage is 4.5 V, the capacitors C1 and C2 are 3.0 pF, and the parameters of the respective semiconductor elements are as shown below:

|  | CHANNEL LENGTH L (microns) | CHANNEL WIDTH W (microns) |
|---|---|---|
| TP1, TP3 | 2.0 | 10.5 |
| TP2, TP4 | 2.0 | 21.0 |
| TN1, TN3 | 1.5 | 3.5 |
| TN2, TN4 | 1.5 | 7.0 |

The gate capacitance was $1.456 \times 10^{-3}$ pF/micrometers$^2$ in each case.

It will be seen from FIGS. 3a and 3b, that the time lag from the input change to output change has been reduced by 60% by the improvement of the embodiment of FIG. 2.

The circuit shown in FIG. 2 can be incorporated in a sense amplifier for a static RAM to receive, on the first and the second input signal lines, complementary signals from a memory cell. An example of such a sense amplifier is shown in the U.S. Pat. No. 4,509,147, disclosure thereof being incorporated herein by reference. The circuit of FIG. 2 of the present application can be used in substitution for the circuits P1 and P2 shown in FIG. 6 of the above-referenced U.S. Patent.

In the embodiments described and shown in the drawing figures, in a pair of current mirror circuits the capacitor C1 is connected to couple the nodes N1 and N4, and the capacitor C2 is connected to couple the nodes N2 and N3. Thus, each output node N2 and N4 is capacitively coupled to a node within the pair of current mirror circuits undergoing the same tendency of potential change, due to the function of the pair of current mirror circuits, so that where the gate inputs to the input MOS transistors of the current mirror circuits are in opposite phases, the potential changes on the output nodes are effectively "assisted" by the above mentioned node undergoing the same potential change, and the time required for the amplification can be reduced.

What is claimed is:

1. A semiconductor memory device, comprising:
    a plurality of memory cells, each of which delivers a complementary pair of bitline signals when accessed;
    and at least one sense amplifier connected to receive said bitline signals from an accessed one of said cells;
    wherein said sense amplifier comprises first and second voltage amplifiers, each including:
    first and second active loads;
    first and second drive transistors, connected to pull current through said first and second active loads respectively;
    said first drive transistor and active load being connected at a first node, which is also connected to regulate the impedance of said first and second active loads, and said second drive transistor and active load being connected at a second node, which is also connected to provide an output signal of said voltage amplifier;
    said first drive transistor of said first voltage amplifier and said second drive transistor of said second voltage amplifier being connected to receive one of said bitline signals, and said first drive transistor of said second voltage amplifier and said second drive transistor of said first voltage amplifier being connected to receive the other one of said bitline signals;
    said second node of said first voltage amplifier also being coupled to partially drive said first node of said second voltage amplifier, and said second node of said second voltage amplifier also being coupled to partially drive said first node of said first voltage amplifier.

2. A device as claimed in claim 1, wherein said drive transistors are field effect transistors.

3. A device as claimed in claim 1, wherein said active loads are field effect transistors.

4. A device as claimed in claim 1 wherein said active loads and said drive transistors are field effect transistors.

5. A device as claimed in claim 1 wherein said active loads are P-MOS transistors and said drive transistors are N-MOS transistors.

* * * * *

UNITED STATES PATENT AND TRADEMARK OFFICE
CERTIFICATE OF CORRECTION

PATENT NO. : 4,907,201

DATED : March 6, 1990

INVENTOR(S) : Hiroshi Minami et al

It is certified that error appears in the above-identified patent and that said Letters Patent is hereby corrected as shown below:

On the title page, at line [63], "Pat. No. 4,661,779" should read --Pat. No. 4,767,942--.

Column 1, line 5, "4,661,779" should read --4,767,942--.

Signed and Sealed this

Second Day of March, 1993

Attest:

STEPHEN G. KUNIN

*Attesting Officer*  Acting Commissioner of Patents and Trademarks